(12) United States Patent
Nakanishi et al.

(10) Patent No.: US 9,406,404 B2
(45) Date of Patent: Aug. 2, 2016

(54) COLUMN REDUNDANCY SYSTEM FOR A MEMORY ARRAY

(75) Inventors: Takuya Nakanishi, Tsukuba (JP); Takumi Nasu, Tsuchiura (JP); Tim Cowles, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1184 days.

(21) Appl. No.: 11/895,072

(22) Filed: Aug. 22, 2007

(65) Prior Publication Data

US 2009/0055621 A1 Feb. 26, 2009

(51) Int. Cl.
*G06F 12/00* (2006.01)
*G11C 29/00* (2006.01)

(52) U.S. Cl.
CPC ............ *G11C 29/808* (2013.01); *G11C 29/804* (2013.01)

(58) Field of Classification Search
CPC ...... G11C 29/70; G11C 29/702; G11C 29/72; G11C 29/76; G11C 29/78; G11C 29/781; G11C 29/785; G11C 29/787; G11C 29/789; G11C 29/81; G11C 29/812; G11C 29/846; G11C 29/848
See application file for complete search history.

(56) References Cited

U.S. PATENT DOCUMENTS

| | | | |
|---|---|---|---|
| 5,331,593 A | 7/1994 | Merritt et al. | 365/189.11 |
| 6,097,648 A | 8/2000 | Bessho et al. | 365/203 |
| 6,314,011 B1 * | 11/2001 | Keeth et al. | 365/51 |
| 6,459,627 B1 | 10/2002 | Sakamoto et al. | 365/190 |
| 6,542,428 B2 | 4/2003 | Hidaka | 365/230.03 |
| 6,850,452 B2 | 2/2005 | Keeth et al. | 365/226 |
| 7,515,501 B2 | 4/2009 | Bessho et al. | 365/230.03 |
| 2003/0028710 A1 * | 2/2003 | Shinohara et al. | 711/104 |
| 2006/0053361 A1 * | 3/2006 | Kim | 714/766 |
| 2008/0080291 A1 | 4/2008 | Ha | 365/230.06 |
| 2008/0291766 A1 | 11/2008 | Bessho et al. | 365/230.06 |

* cited by examiner

*Primary Examiner* — Kevin Verbrugge
*Assistant Examiner* — Tahilba Puche
(74) *Attorney, Agent, or Firm* — Dorsey & Whitney LLP (57) ABSTRACT

A memory array having a main memory array and a redundant memory array. The redundant memory array includes redundant memory arranged in replacement units to which memory of the main memory are mapped. Each replacement unit includes columns of redundant memory arranged in input-output (IO) groups and further includes columns of redundant memory from a plurality of IO groups. The IO groups have columns of memory associated with a plurality of different IOs and the plurality of IO groups of the replacement unit adjacent one another.

20 Claims, 8 Drawing Sheets

COLUMN REDUNDANCY SYSTEM FOR A MEMORY ARRAY

TECHNICAL FIELD

The invention relates generally to redundancy memory for a memory array, and more particularly, to a redundancy system for a memory array having replacement units that include adjacent columns of memory associated with a plurality of data input-output and a plurality of column-select lines.

BACKGROUND OF THE INVENTION

Typical integrated memory devices include arrays of memory cells arranged in rows and columns. In many such memory devices, several redundant rows and columns are provided to replace malfunctioning memory cells found during testing. Testing is typically performed by having predetermined data values written to selected row and column addresses that correspond to memory cells. The memory cells are then read to determine if the data read matches the data written to those memory cells. If the read data does not match the written data, then those memory cells are likely to contain defects which will prevent proper operation of the memory device.

The defective memory cells may be replaced by remapping the memory addresses corresponding to a portion of main memory including the defective memory cells to redundant memory. A malfunctioning memory cell in a column or a row is substituted with a corresponding redundant element, such as an entire column or row of redundant memory cells, respectively. Therefore, a memory device need not be discarded even though it contains defective memory cells. Substitution of one of the redundant rows or columns is typically accomplished in a memory device by programming a specific combination of fuses, or if the memory device uses antifuses, by programming a specific combination of antifuses, located in one of several fuse or antifuse circuits in the memory device with memory address information identifying the portion of memory remapped to redundant memory.

When a row or column address received by the memory device matches one of the programmed addresses, the redundant element associated with the matching address is accessed instead of the row or column having the defective memory cells. In determining whether an address received by the memory device matches one of the programmed addresses, each incoming address is compared to the memory addresses programmed in the fuse or antifuse circuits. If a match is detected, then the corresponding redundant row or column is accessed, and the defective row or column is ignored, thus, remapping the memory address to the redundant element.

As previously discussed, memory addresses corresponding to defective memory are remapped to redundant memory. The redundant memory being arranged in replacement units, which is the smallest arrangement of redundant memory that can be used to correct a defect. For defects that affect more memory than included in a replacement unit, multiple replacement units are used to repair the defect. Conversely, where a defect affects a small number of memory cells, an entire replacement unit is used nevertheless. For example, in a memory having a replacement unit of four columns, a single bit failure is repaired by remapping memory addresses for four columns of main memory which include the single bit failure to the four columns of a replacement unit of redundant memory, even though only one memory cell is defective. A memory device can be designed with smaller replacement units to improve efficient use of redundant memory. However, where the replacement unit is smaller, such as one column of memory, the number of fuses or antifuses necessary to remap the memory addresses for a large block of defects to each one of the column replacement units may be significant since each replacement unit to which a memory address of main memory is remapped is associated with antifuses that are programmed with the remapped memory address. As a result, having more (smaller) replacement units means having more antifuses. Having the necessary number of fuses or antifuses, as well as the necessary reading and decoding circuitry to utilize the redundant memory, may consume a relatively significant amount of space on a semiconductor substrate on which the memory is formed.

Additionally, redundant memory may be arranged to replace defective memory of only a respective section of the memory array. That is, each memory section of a memory array may include a certain number of replacement units that can be used to repair defective memory located only in the respective memory section. When the redundant memory associated with a section has been exhausted, but additional defects in the memory section are still present, the memory cannot be fully repaired even if there is unused redundant memory associated with another section. As a result, it may be not be possible to fully repair a memory array under certain arrangements of defects although the total number of defective memory is less than the total number of redundant memory available. That is, the locations of the defects in combination with the number of defects can create a situation that may not be repairable due to the particular design of the redundant memory (e.g., size and arrangement of replacement units, association of replacement units to particular groups of memory).

Therefore, there is a need for a redundant memory design that is flexible and provides efficient repair of defective memory in a memory array.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and circuit operations have not been shown in detail in order to avoid unnecessarily obscuring the invention.

Figure 1:
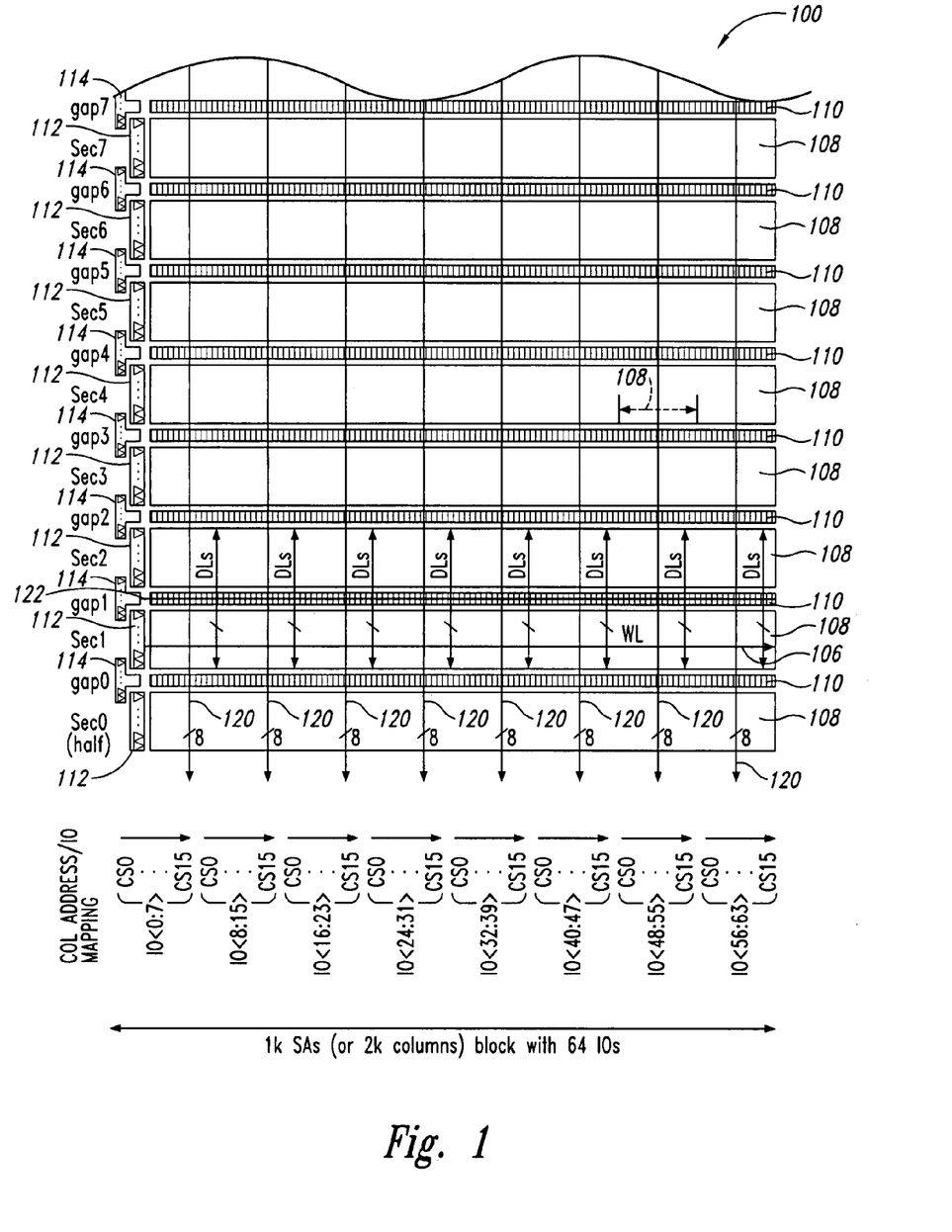
FIG. 1 is a block diagram of a portion of a memory array in which an embodiment of the present invention may be implemented.

FIG. 1 illustrates a portion of a memory array 100. Embodiments of the present invention can be implemented in the memory array 100. The memory array is arranged in memory sections 108 in which memory cells are arranged in rows and columns. The memory sections 108 are separated by sense amplifier regions 110 in which conventional sense amplifiers for the sections are located. The rows of memory cells are represented by word lines (not shown), as known. The word lines of the memory array 100 are arranged parallel to the sense amplifier regions 110 and the columns are arranged perpendicular to the sense amplifier regions 110. In the arrangement of FIG. 1, the columns of memory of a memory section 108 are coupled to one of two sets of sense amplifiers, with each set located in the sense amplifier regions 110 adjacent the memory section. In a particular example, each of the memory sections 108 include 1M of memory cells arranged as 512 rows by 2,048 (2K) columns of memory cells.

The memory array 100 includes column select (CS) lines (not shown) that extend along the length of the sections 108 parallel to the word lines, generally in the sense amplifier regions 110. The CS lines are coupled to CS gates (not shown) which are used to selectively couple sense amplifiers (i.e., columns of memory) to local input-output (LIO) lines. The LIO lines are generally arranged perpendicular to the CS lines. The CS lines are coupled to a respective CS driver 114 which drives the CS line corresponding to the column address for the memory to be accessed. In the particular embodiment illustrated in FIG. 1, the CS lines are logically grouped in groups of 16, with each memory section 108 having eight groups of 16 CS lines. When a CS line is activated, eight columns of memory from each of the eight groups are coupled to a respective set of 8 LIO lines. LIO lines 120 are illustrated in FIG. 1 and represent the LIO lines associated with activated CS line 122. Each of the eight LIO lines 120 are eight lines wide, providing a total of 64 LIO lines coupled to 64 columns of memory in response to the activated CS line 122. As a result, during a read operation, 64 bits of data are coupled from a memory section to the LIO lines. The specific embodiment described with reference to FIG. 1 is provided by way of example and alternative embodiments may be configured differently. For example, alternative embodiments have different numbers of CS and LIO lines and different line widths, among other differences.

A more detailed description of an example of the memory array 100 is provided in U.S. patent application Ser. No. 11/807,272, entitled MEMORY ARCHITECTURE HAVING LOCAL COLUMN SELECT LINES and filed on May 24, 2007, which is incorporated herein by reference.

Figure 2:
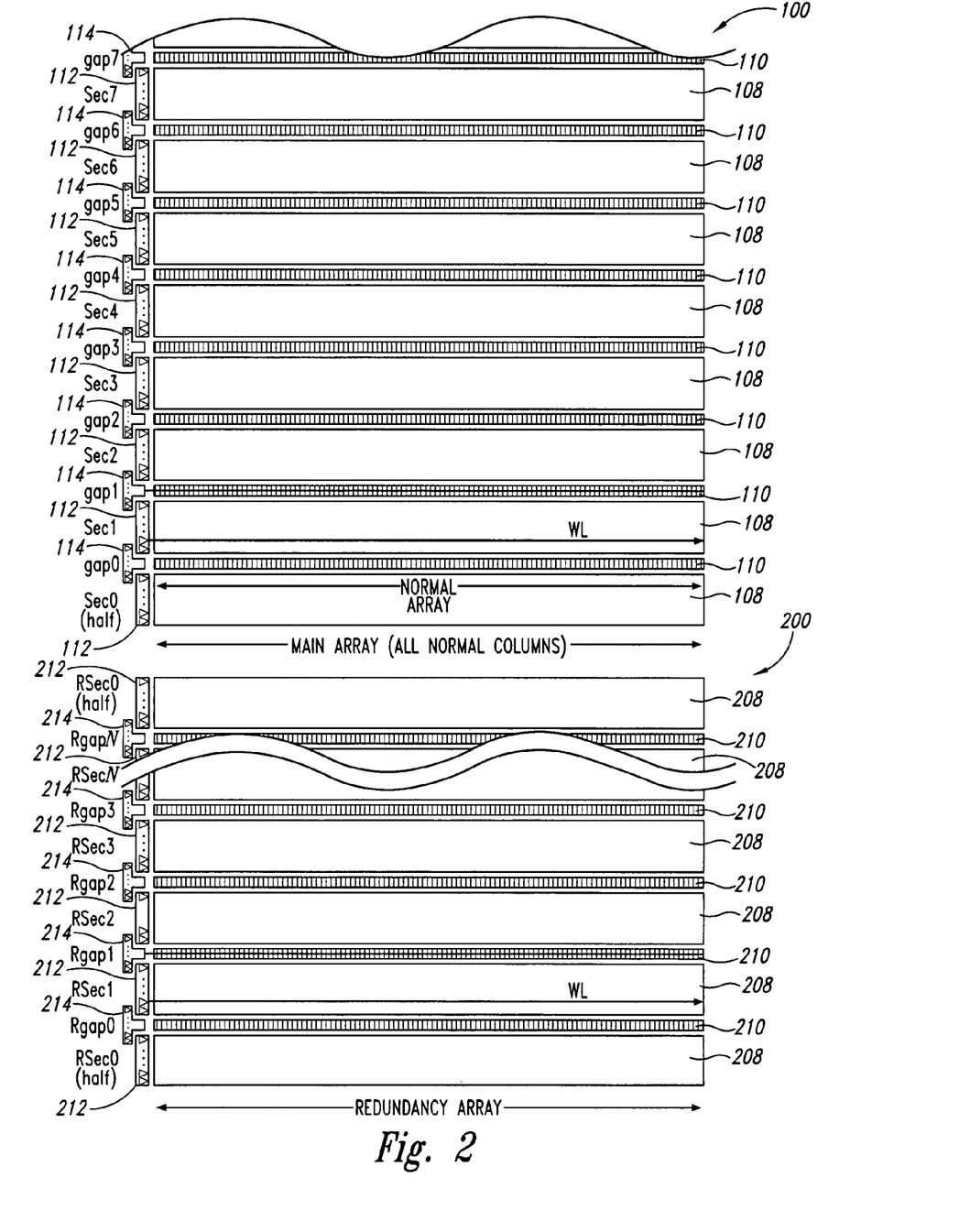
FIG. 2 is a block diagram of the memory array of FIG. 1 and a redundant memory array according to an embodiment of the present invention.

FIG. 2 illustrates a redundant memory array 200 according to an embodiment of the present invention for the memory array 100. The redundant memory array 200 is a separate array from the memory array 100 and includes redundant columns of memory to which defective memory in the memory 100 are mapped. In some embodiments of the invention, the redundant memory array 200 includes redundant rows of memory as well, whereas in other embodiments of the invention, the redundant memory array 200 does not include any redundant rows of memory. For example, redundant rows of memory are included in the memory array 100. In still other embodiments, both the memory array 100 and the redundant memory array 200 include redundant rows of memory.

The redundant memory array 200 is arranged in redundant memory sections 208 in which memory cells are arranged in rows and redundant columns. The memory sections 208 are separated by sense amplifier regions 210 in which sense amplifiers for the memory sections are located. The rows of memory cells are represented by word lines (WLs) (not shown), as known, which are coupled to WL drivers 212. Although not shown, the word lines of the memory array 200 are arranged parallel to the sense amplifier regions 210 and redundant columns are arranged perpendicular to the sense amplifier regions 210. The arrangement of CS lines and LIO lines in the redundant memory array 200 is the same as for the memory array 100. That is, the CS lines extend along the length of the sections 208, generally in the sense amplifier regions 210 and the LIO lines are arranged perpendicular to the CS lines. As with the CS lines of the memory array 100, the CS lines of the redundant memory array 200 are coupled to CS drivers 214, which activate the CS lines corresponding to the remapped memory address to couple redundant columns of memory to the LIO lines of the redundant memory array 200.

As will be described in more detail below, defective columns of memory in the memory array 100 are remapped to redundant columns of memory in the redundant memory array 200. The memory addresses for the defective columns of memory are permanently programmed through the use of non-volatile memory, such as antifuses or fuses. The term "fuse" as used in the present application generally refer to programmable non-volatile memory, and is not intended to limit embodiments of the present invention to using only fuses. As known, with the use of redundant memory, upon receipt of an address matching one of the programmed addresses, the redundant memory to which the address is mapped is accessed instead of the defective memory in the main array, such as memory array 100.

Figure 3:
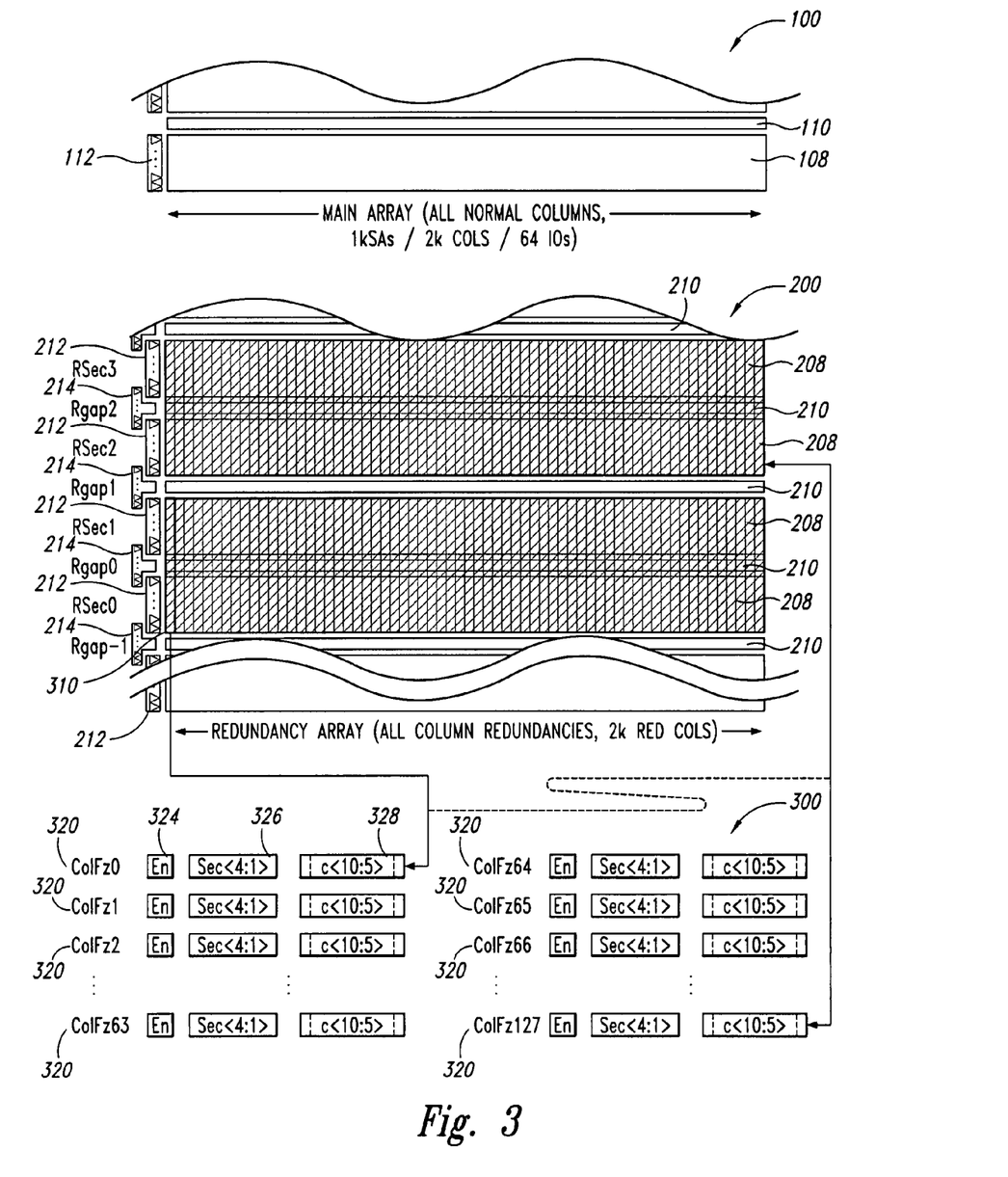
FIG. 3 is a block diagram of the memory array of FIG. 1 and the redundant memory array of FIG. 2 including redundant column fuse bank according to an embodiment of the present invention.

FIG. 3 illustrates the memory array 100 and further illustrates the redundant memory array 200 and redundant column fuse bank 300 according to an embodiment of the present invention. As shown in FIG. 3, the columns of memory of the redundant memory array 200 are arranged in replacement units of 32 adjacent columns. The particular number of columns in a replacement unit is provided by way of example. The number of columns in a replacement unit can be modified without departing from the scope of the present invention. A replacement unit is the minimum grouping of memory that is used when addresses in the memory array 100 are remapped to the redundant memory array. Typically, one fuse group is used to remap defective memory to a replacement unit of redundant memory. In contrast to conventional redundancy arrangements, the replacement units of embodiments of the present invention are not limited to "input-output (IO) based" replacement or "column select (CS) based" replacement, as will be explained in more detail below.

As known, replacement units for IO based replacement of redundant columns of memory typically replace the same corresponding IO for each of the CS lines of one group of CS lines. For example, with respect to the arrangement of CS lines in the memory array 100 (FIG. 1), the CS lines are grouped in groups of 16 and there are eight logical groups of 16 CS lines across a memory section 108. Each CS line of a group activates eight sense amplifiers (i.e., 16 columns), each sense amplifier corresponds to an IO (resulting in eight IOs per CS line). Using the previously described CS line and IO arrangement as an example, a conventional IO based replacement results in a column replacement unit that requires replacing 16 sense amplifiers, namely, the 16 sense amplifiers that correspond to the same IO for each CS line of a group of 16 CS lines. The resulting replacement unit appears as a group of "stripes." The stripes refer to the 32 non-adjacent columns of memory that are replaced by the replacement unit (two columns for each sense amplifier, one column extending into each memory section adjacent to the sense amplifier region).

As also known, the replacement units for a CS based replacement replace the columns associated with the same CS line in each one of the groups of CS lines for a memory section. Using the CS line and IO arrangement of the memory array 100 (FIG. 1) as an example, a replacement unit for CS based replacement replaces the columns coupled to the eight adjacent sense amplifiers of the same CS line in each one of the eight groups of CS lines across the memory section 108. As a result, the 16 adjacent columns (two columns for each sense amplifier) associated with the same CS line of every group of 16 CS lines is replaced for a total of 128 columns per replacement unit.

Although IO based replacement has reasonable resolution, that is, when replacing single bit or single column defects, only 32 columns of redundant memory are used (assuming the IO arrangement of the memory array 100), IO based replacement requires several fuse groups to repair larger groups of defective memory. An example of such a defect includes several adjacent columns of defective memory, a block of columns (i.e., adjacent columns of a CS line group), or an entire memory section. The fuse groups required to provide remapping to the replacement units of IO based replacement can be many, and consume significant space on a memory device.

In contrast to IO based replacement, CS based replacement allows for the use of fewer fuse groups but at the expense of reasonable resolution. As previously discussed, a CS based replacement unit for the specific example previously discussed typically replaces (assuming the CS line arrangement of the memory array 100) 16 adjacent columns of memory corresponding to the same CS line in each of the eight CS line groups, resulting in a total replacement of 128 columns per replacement unit. Although CS based replacement has the benefit of replacing many defective columns using less fuse groups, there are disadvantages when replacing low-bit defects, such as single bit or single column defects. That is, when single bit or single column defects are replaced, only one or two redundant columns are needed for repair and the remaining redundant columns of the 128 columns are wasted.

Embodiments of the present invention include a replacement unit that is not conventional IO based or CS based. Replacement units according to embodiments of the present invention include adjacent columns from more than one IO and from more than one CS line. Although specific examples will be discussed below, it will be appreciated by those ordinarily skilled in the art that the particular number of columns and particular arrangement can be modified without departing from the scope of the present invention.

In the particular embodiment illustrated in FIG. 3, a replacement unit of 32 adjacent columns are used. More specifically, the 32 adjacent columns are equivalent to two CS lines (16 adjacent columns for each CS line). Unlike IO based replacement units, the columns are adjacent rather than "striped" based on the IO being replaced and unlike CS based replacement units, the columns are not replaced for each group of CS lines across a memory section. Although the number of columns replaced using the present example replacement unit (i.e., 32 columns) is the same as for an IO based replacement unit using the same arrangement, the arrangement of adjacent columns provides a more flexible replacement unit.

In the embodiment described with reference to FIG. 3, two memory sections of redundant memory adjacent a sense amplifier gap are divided into 64 replacement units 310. Four memory sections are shown in FIG. 3 for a total of 128 replacement units 310 that are illustrated. Each of the replacement units 310 is associated with a fuse group 320 which can be programmed to remap particular memory addresses of the memory array 100 to a corresponding replacement unit 310 of the redundant memory array 200.

A fuse group 320 can include several fuses (or antifuses) that are used to identify the address of the memory to be remapped to the replacement unit as well as fuses enabling a replacement unit for correcting defective memory. For example, in the particular arrangement shown in FIG. 3, a fuse group 320 includes a fuse 324 for enabling the corresponding replacement unit, fuses 326 for identifying the memory section of the memory array 100 having the defective memory, and several fuses 328 for identifying the adjacent 32 columns that are remapped to the replacement unit 310 as well as the data IO to which data from the replacement unit is to be coupled.

Figure 4:
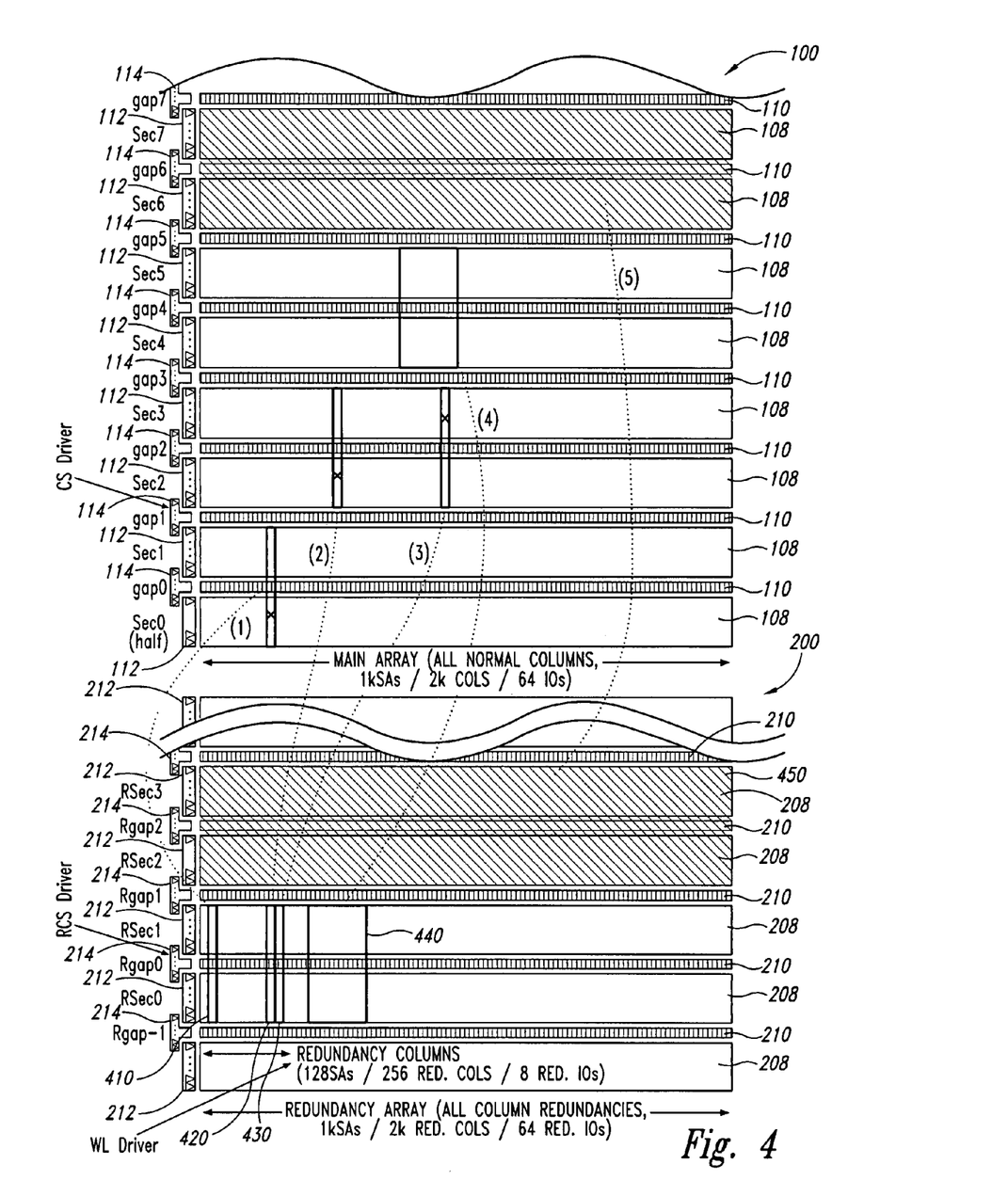
FIG. 4 is a block diagram illustrating replacement of defective memory in the memory array of FIG. 1 with replacement units of the redundant memory array of FIG. 2 according to an embodiment of the present invention.

FIG. 4 illustrates an example of repairing defective columns of memory in the memory array 100 with column replacement units 310 of the redundant memory array 200. Defects (1) and (2) in FIG. 4 represent single bit defects. Replacement unit 410 is used to repair defect (1) by having addresses corresponding to the 32 adjacent columns including defect (1) mapped to the 32 adjacent columns of the replacement unit 410 by programming the appropriate redundancy memory information into the fuse group 320 (not shown in FIG. 4) associated with the replacement unit 410. Similarly, replacement unit 420 is used to repair defect (2) by having the addresses corresponding to the 32 adjacent columns including defect (2) to the 32 adjacent columns of the replacement unit 420 by programming the appropriate redundancy memory information into the fuse group 320 associated with the replacement unit 420.

Repairing defects (1) and (2) using the replacement units 310 (FIG. 3) is the same as for an IO based replacement unit in that 32 columns are used to repair each of the single bit defects. However, the replacement units 310 are more efficient in comparison to a CS based replacement unit because 32 adjacent columns are used to repair each defect, as shown in FIG. 4, whereas 128 columns are used for repairing each of the single bit defects (1) and (2) with CS based replacement units.

FIG. 4 further illustrates a multi-bit defect (3) that affects several adjacent columns. A replacement unit 430 is used to repair defect (3) by having the memory addresses corresponding to the 32 adjacent columns including defect (3) to the redundant memory of the replacement unit 430. In contrast to either IO based or CS based replacement units, only 32 adjacent columns are used to repair defect (3). An IO based replacement unit would require 32 columns to repair each defective column of defect (3). For example, if defect (3) represented seven defective columns, a total of 224 columns would be replaced using an IO based replacement unit. A CS based replacement unit would require 128 columns to repair the seven defective columns of defect (3).

Defect (4) represents a block failure where nearly 256 adjacent columns are defective. Eight replacement units (referenced by reference number 440) are used to repair defect (4) by mapping the memory addresses of the 256 columns including defect (4) to the 256 columns of the eight replacement units 440. Redundant memory arranged as IO based replacement units would also require 256 columns (eight IO based replacement units) to repair defect (4). However, redundant memory arranged as CS based replacement units would require using 2,048 columns to repair defect (4), essentially consuming the redundant memory of two entire redundant memory sections 208.

Defect (5) represents a block failure where nearly or all 2,048 columns of memory of two adjacent memory sections 108 are defective. The number of columns used to repair defect (5) is the same for redundant memory arranged as replacement units 310, IO based replacement units, or CS based replacement units. However, where defects (1)-(5) are all present in the memory array 100, four memory sections 208 of redundant memory arranged as replacement units 310 can repair all of defects (1)-(5) and uses the least number of columns; four memory sections 208 of redundant memory arranged as IO based replacement units can repair all of defects (1)-(5) but using more redundant columns of memory; and four memory sections 208 of redundant memory arranged as CS based replacement units cannot repair all of defects (1)-(5).

Figure 5A:
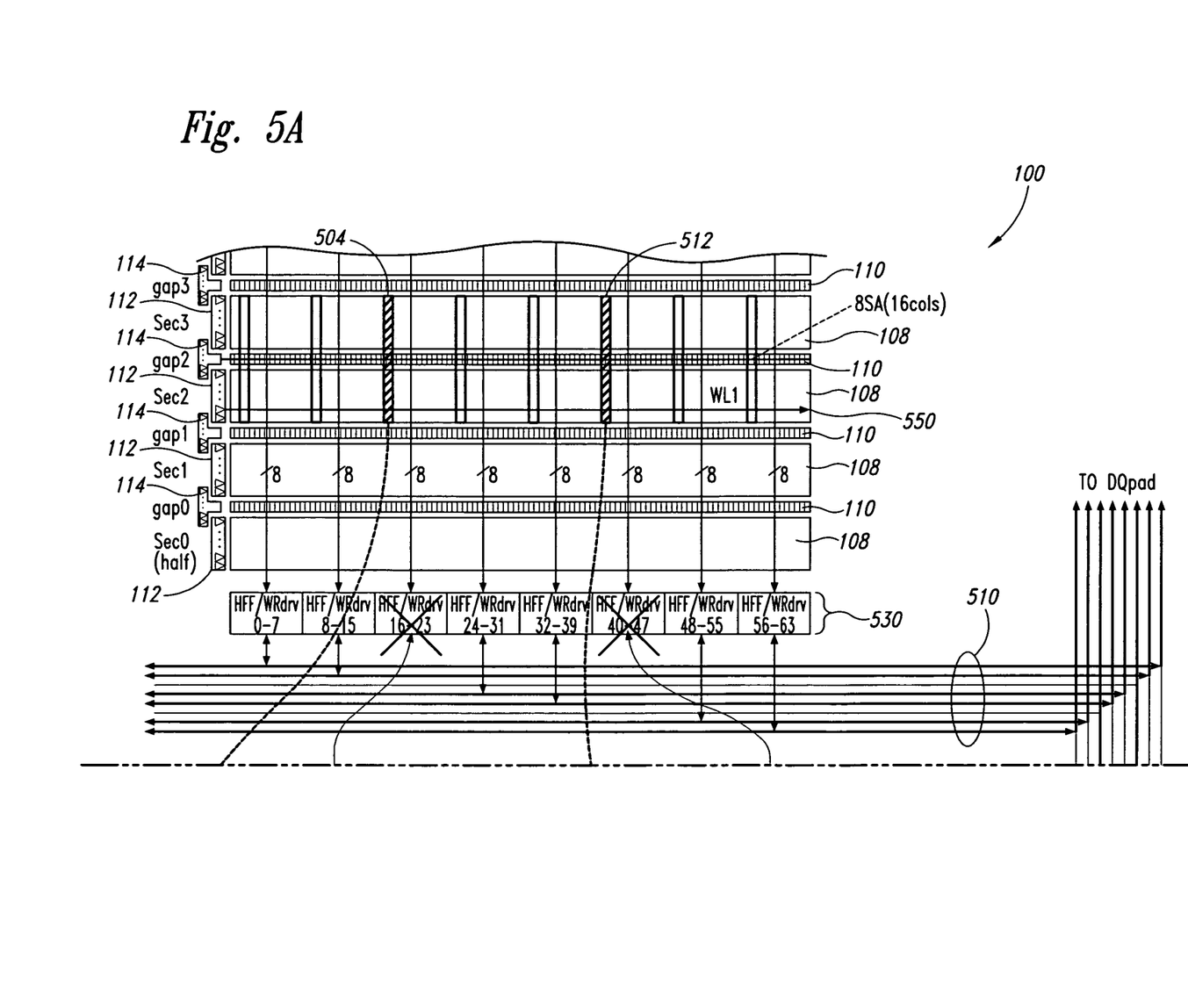
FIGS. 5A and 5B are a block diagram illustrating replacement of defective memory in the memory array of FIG. 1 with replacement units of the redundant memory array of FIG. 2 according to an embodiment of the present invention.
Figure 5B:
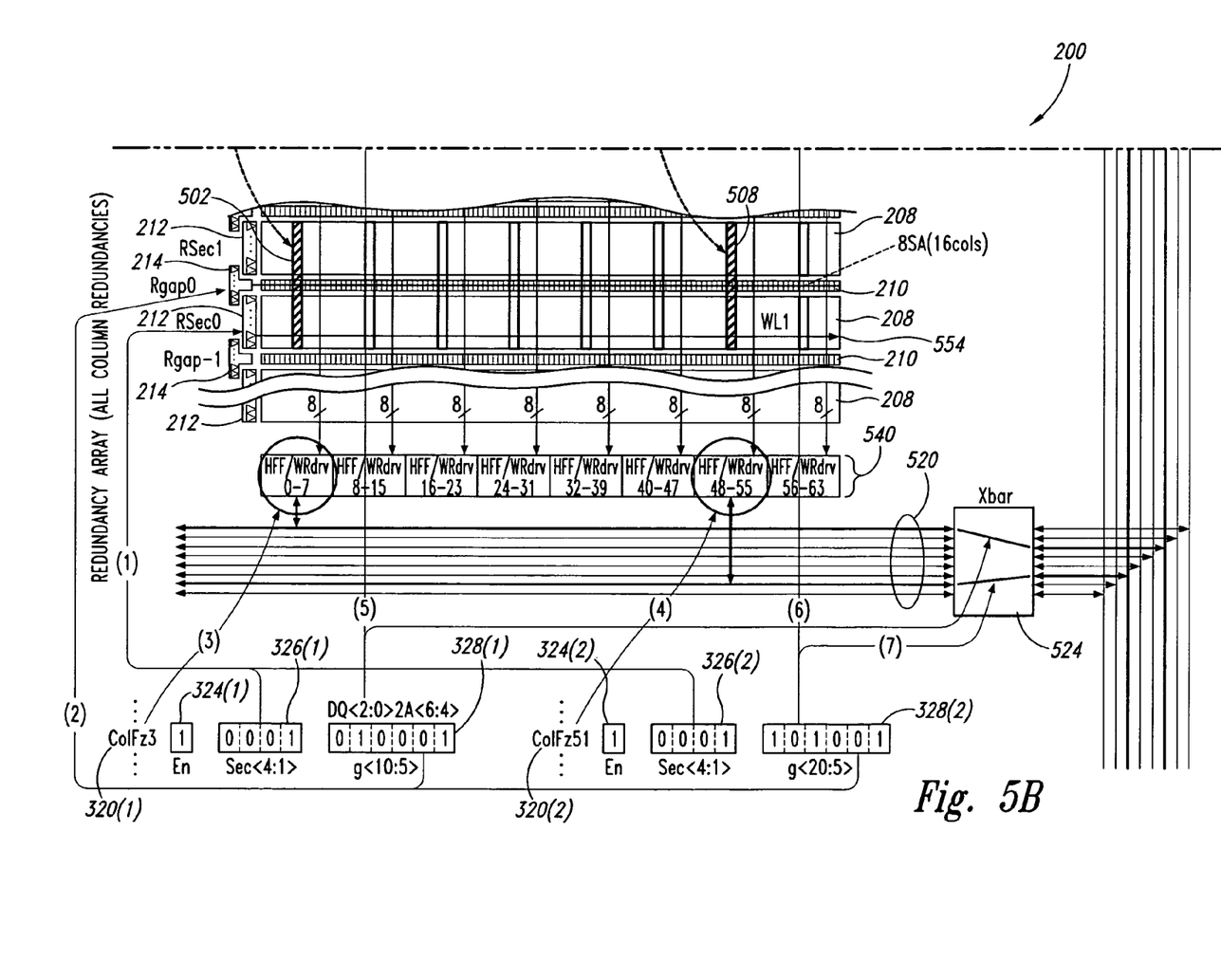

FIGS. 5A and 5B illustrate an example of repairing defects in the memory array 100 using replacement units of the redundant memory array 200 as programmed by fuse groups 320 of the redundant column fuse bank 300. More specifically, memory addresses of memory 504, 510, which include defects, of the memory array 100 are mapped to replacement units 502, 508 of the redundant memory array 200. Fuse group 320(1) corresponds to the replacement unit 502 and is programmed with the redundancy memory information to remap addresses from the memory 504 to the replacement unit 502. Fuse group 320(2) corresponds to the replacement unit 508 and is programmed with the redundancy memory information to remap addresses from the memory 510 to the replacement unit 508. FIGS. 5A and 5B illustrate additional conventional circuitry for ease of explanation of operation.

In operation, when word line WL1 550 in memory section Sec2 of the memory array 100 is activated, section fuses 326 of all fuse groups 320 are checked if any have been programmed with redundancy memory information that matches the address information for Sec2. If there is a match (in the present example, the memory address information programmed in fuse groups 320(1) and 320(2) match) the same word line (WL1 554 in the present example) in the redundancy array 200 is also activated. See arrow (1) in FIGS. 5A and 5B. If the columns of memory being accessed correspond to CS line CS2 (i.e., column address bits CA<6:3>=0x2), then the CS2 line is activated in the memory array 100 as usual. The accessed columns of memory are coupled to LIO lines (not shown) to couple data to helper flip-flop/write drivers (HFF/WRDs) 530.

Concurrently, all fuse groups 320 are checked if there is a match to CA<6:3>=0x2. Since the memory address information in the fuse group 320(1) and 320(2) match, redundancy column select line RCS6 (corresponding to the CS line for the replacement units 502, 508) is also activated in the redundancy array 200. See arrow (2) in FIGS. 5A and 5B. In response to the RCS6 line being activated in the redundancy array 200 coupling the redundant columns of memory to redundant LIO lines (not shown), HFF/WRDs 540 corresponding to the replacement units 502, 508 are enabled. See arrows (3) and (4) in FIGS. 5A and 5B. Additionally, the HFF/WRDs 530 corresponding to the memory 504, 510 are disabled by programmed memory to prevent data collision on a main data bus 512 with data provided from the replacement units 502, 508. The data from the replacement units 502 are provided over the redundancy data bus 520 through a cross-bar switch 524. As shown in FIGS. 5A and 5B, the cross-bar switch 524 couples the data from the replacement units 502, 508 to the appropriate data IO according to information programmed in fuses 328 of the fuse groups 324(1), 324(2). As a result, 16 bits of data (for DQ2 & DQ5) from the memory array 100 array are discarded and 16 bits of data provided by the replacement units 502, 508 in the redundancy memory array 200 are provided instead.

The previously discussed embodiments included redundant columns of memory located in a redundant memory array that are not associated to particular memory sections of a memory array and that can be used to repair defects of different memory sections. In some embodiments of the present invention, redundant rows of memory are included in the redundant memory array with the redundant columns of memory. In alternative embodiments, redundant rows are included in the main memory array in addition or alternatively to any redundant rows of memory included in the redundant memory array. In some embodiments, the number of rows in a memory section of a redundant memory array is the same as for memory sections of the main memory array. In other embodiments, the number of rows in a memory section of a redundant memory array is different than the number of rows in memory sections of the main memory array. For example, the number of rows in the memory sections of the redundant memory array is less than or greater than the number of rows in the main memory section. It may be desirable to have the number of rows in the redundant memory array less than the number of rows in the main memory array to offset current consumption during memory access operations.

Figure 6:
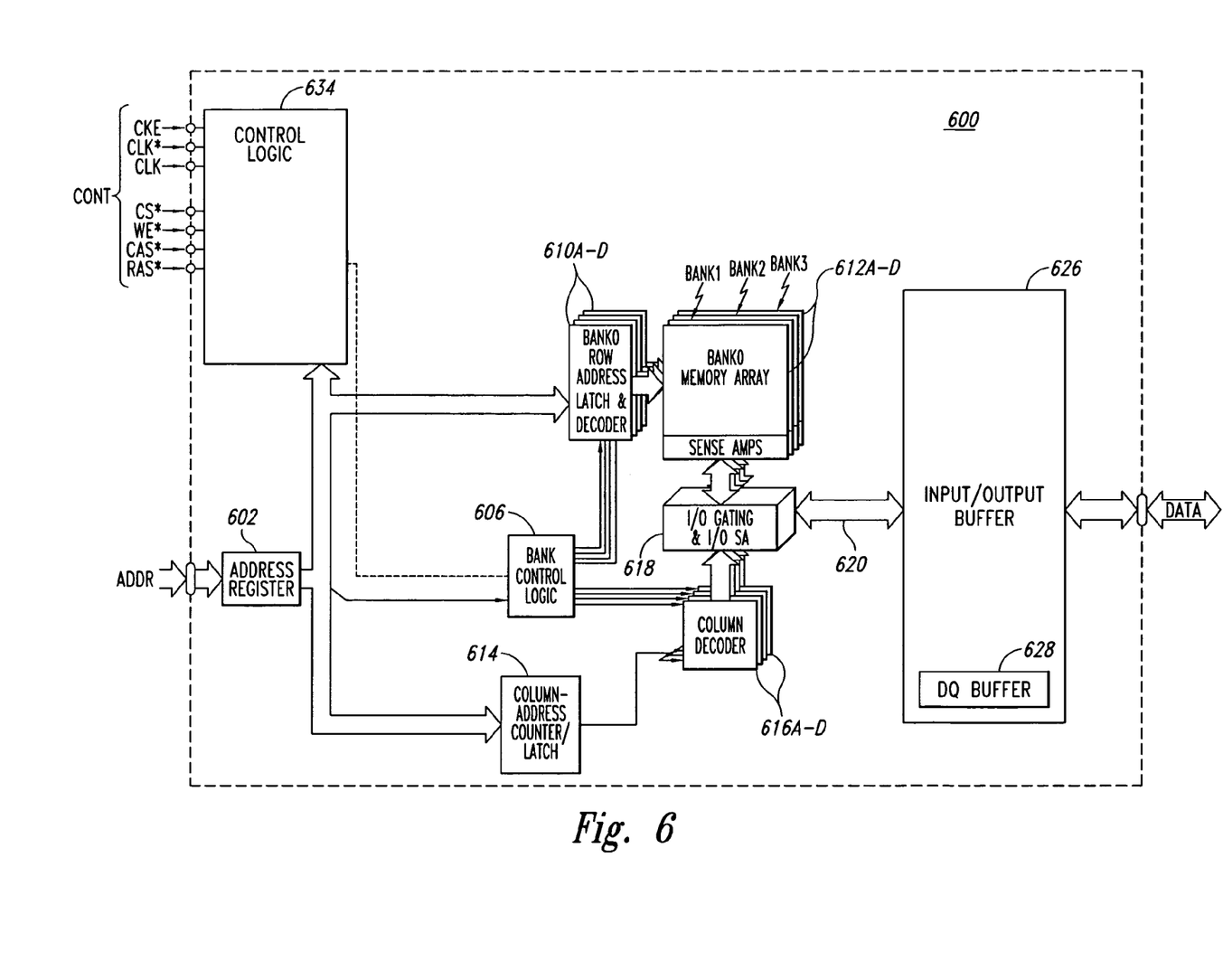
FIG. 6 is a block diagram of a memory system including an embodiment of the present invention.

FIG. 6 is a functional block diagram of a memory system 600 that includes arrays of memory having redundant memory according to an embodiment of the present invention. The memory system 600 in FIG. 6 will be described as a synchronous dynamic random access memory (SDRAM), although principles described herein are applicable to any array of memory included in a memory system. For example, the clock enable signal CKE enables clocking of the command decoder 634 by the clock signals CLK, CLK* to latch and decode an applied command, and generate a sequence of internal clocking and control signals that control various components of the memory system 600 to execute the function of the applied command. When enabled by the CKE signal, the input/output buffer transfers data from and into the memory system 600 for read and write operations, respectively, in response to the CLK, CLK* signals. For example, the clock enable signal CKE enables clocking of the command decoder 634 by the clock signals CLK, CLK* to latch and decode an applied command, and generate a sequence of internal clocking and control signals that control various components of the memory system 600 to execute the function of the applied command. When enabled by the CKE signal, an input/output buffer 626 transfers data from and into the memory system 600 for read and write operations, respectively, in response to the CLK, CLK* signals.

A control logic and command decoder 634 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read or a write command. The clock enable signal CKE enables operation of the memory system 600 according to the CLK, CLK* signals.

The memory system 600 further includes an address register 602 that receives row, column, and bank addresses over an address bus ADDR, with the a memory controller (not shown) typically supplying the addresses. The address register 602 receives a row address and a bank address that are applied to a row address latch and decoder and bank control logic circuit 606, respectively. The bank control logic 606 activates the row address latch and decoder 610A-D corresponding to either the bank address received from the address register 602, and the activated row address latch and decoder latches and decodes the received row address. In response to the decoded row address, the activated row address latch and decoder 610A-D applies various signals to a corresponding memory bank 612A-D to thereby activate a row of memory cells corresponding to the decoded row address. Each memory bank 612A-D includes a memory-cell array having a plurality of memory cells arranged in rows and columns, and the data stored in the memory cells in the activated row is stored in sense amplifiers in the corresponding memory bank. At least one memory bank 612A-D includes an array of memory having redundant memory according to an embodiment of the invention.

A column address is also applied on the ADDR bus after the row and bank addresses, and the address register 602 applies the column address to a column address counter and latch 614 which, in turn, latches the column address and applies the latched column address to a plurality of column decoders 616A-D. The bank control logic 606 activates the column decoder 616A-D corresponding to the received bank address, and the activated column decoder decodes the applied column address. In response to the column address from the counter and latch 614, the activated column decoder 616A-D applies decode and control signals to an I/O gating circuit 618 which, in turn, accesses memory cells corresponding to the decoded column address in the activated row of memory cells in the memory bank 612A-D being accessed.

In operation, during data read operations, data being read from the addressed memory cells are coupled through the I/O gating and sense amplifier circuit 618 and a data path 620 to an input/output buffer 626. The input/output buffer 626 latches data in a DQ buffer 628 and provides data from the memory system 600 onto a data bus DATA in accordance with the CLK, CLK* signals when the memory system 600 is enabled by the CKE signal. The I/O gating and I/O sense amplifier circuit 618 drive data signals onto the data path 620 to the DQ buffer 628 included in the input/output buffer 626. The input/output line sense amplifiers can be tailored to have different output drive capacities, as previously discussed. During data write operations, an external circuit such as a memory controller (not shown) applies data to the data bus DATA which are clocked into the input/output buffer 626 in accordance with the CLK, CLK* signals. The data are then provided to the memory array through the data path 620 and the I/O gating and I/O sense amplifier circuit 618 to be stored by memory cells in the memory bank 612A-D that correspond to the row, column, and bank addresses.

Figure 7:
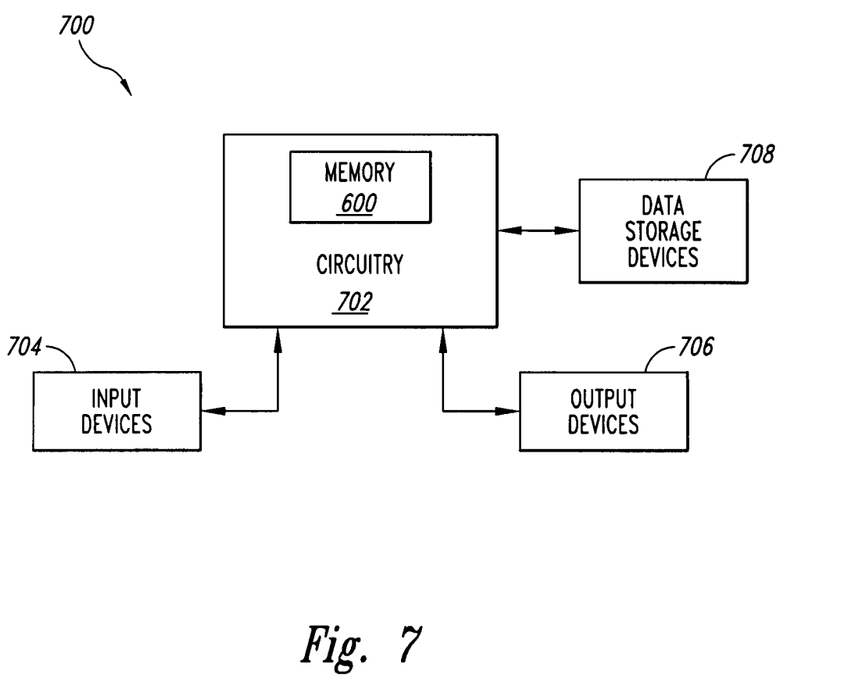
FIG. 7 is a functional block diagram illustrating a processor-based system including the synchronous memory device of FIG. 6.

FIG. 7 is a block diagram of a processor-based system 700 including processor circuitry 702, which includes the memory system 600 of FIG. 6. Typically, the processor circuitry 702 is coupled through address, data, and control buses to the memory system 600 to provide for writing data to and reading data from the memory device. The processor circuitry 702 includes circuitry for performing various processing functions, such as executing specific software to perform specific calculations or tasks. In addition, the processor-based system 700 includes one or more input devices 704, such as a keyboard or a mouse, coupled to the processor circuitry 702 to allow an operator to interface with the processor-based system 700. Typically, the processor-based system 700 also includes one or more output devices 706 coupled to the processor circuitry 702, such as output devices typically including a printer and a video terminal. One or more data storage devices 708 are also typically coupled to the processor circuitry 702 to store data or retrieve data from external storage media (not shown). Examples of typical storage devices 708 include hard and floppy disks, tape cassettes, compact disk read-only (CD-ROMs) and compact disk read-write (CD-RW) memories, and digital video disks (DVDs).

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory array, comprising:
 a main memory array; and
 a redundant memory array having memory arranged in replacement units, each replacement unit comprising adjacent columns of the memory to which defective memory in the main memory array can be mapped, wherein at least two of the adjacent columns of the replacement units correspond to different input/outputs and are selected using different column select lines.

2. The memory array of claim 1, further comprising a bank of programmable non-volatile memory arranged in a plurality of groups, each group configured to store data for a respective replacement unit identifying a memory of the main memory array mapped thereto.

3. The memory array of claim 2 wherein the programmable non-volatile memory being selected from the group consisting of a fuse and an antifuse.

4. The memory array of claim 2 wherein the bank of programmable non-volatile memory comprises at least one of a group of programmable non-volatile memory configured to be programmed to identify a section including defective memory remapped to the redundant memory array, a group of programmable non-volatile memory configured to be programmed to identify adjacent columns of memory mapped to the redundant memory array, a group of programmable non-volatile memory configured to be programmed to enable a respective replacement unit, and a group of a group of programmable non-volatile memory configured to be programmed to identify the input/output to which data from the replacement unit is to be coupled.

5. The memory array of claim 1, further comprising a main data bus coupled to the main memory and configured to relay data to and from the main memory and further comprising a redundancy data bus coupled to the redundant memory array and the main data bus, the redundancy data bus configured to coupled data to and from the redundant memory array through the main data bus.

6. The memory array of claim 5 wherein the redundancy data bus comprises a switch circuit configured to couple a column of the redundant memory to one of a plurality of different input-outputs of the main data bus.

7. The memory array of claim 1 wherein the redundant memory array further includes a plurality of redundancy column select lines, each redundancy column select line associated with the columns of a respective IO group, the replacement units including adjacent columns of redundant memory associated with a plurality of column select lines.

8. The memory array of claim 1 wherein the main memory array and the redundant memory array are separate memory arrays.

9. The memory array of claim 1 wherein the number of columns of main memory mapped to a respective replacement unit is equal to the number of columns included in the replacement unit.

10. The memory array of claim 1 wherein the redundant memory array comprises a plurality of memory sections, the memory sections having columns of memory, and further comprises a plurality of column select lines, at least one replacement unit including adjacent columns of memory from at least two memory sections, each section of the replacement unit associated with a different column select lines.

11. A processor-based system, comprising:
a processor;
a memory controller coupled to the processor and operable to generate memory control and address signals for performing memory operations, including read operations; and
a memory coupled to the processor and operable to perform memory operations in response to the memory control signals, the memory comprising:
a memory array comprising:
a main memory array having memory arranged in rows and columns; and
a redundant memory array having memory arranged in replacement units, each replacement unit comprising adjacent columns of the memory to which defective memory in the main memory array can be mapped, wherein at least two of the adjacent columns of the replacement units correspond to different input/outputs and are selected using different column select lines.

12. The processor-based system of claim 11, further comprising a bank of programmable non-volatile memory arranged in a plurality of groups, each group configured to store data for a respective replacement unit identifying a memory of the main memory array mapped thereto.

13. The processor-based system of claim 12 wherein the programmable non-volatile memory being selected from the group consisting of a fuse and an antifuse.

14. The processor-based system of claim 12 wherein the bank of programmable non-volatile memory comprises at least one of a group of programmable non-volatile memory configured to be programmed to identify a section including defective memory remapped to the redundant memory array, a group of programmable non-volatile memory configured to be programmed to identify adjacent columns of memory mapped to the redundant memory array, a group of programmable non-volatile memory configured to be programmed to enable a respective replacement unit, and a group of a group of programmable non-volatile memory configured to be programmed to identify the input/output to which data from the replacement unit is to be coupled.

15. The processor-based system of claim 11 wherein the redundant memory array further includes a plurality of redundancy column select lines, each redundancy column select line associated with the columns of a respective 10 group, the replacement units including adjacent columns of redundant memory associated with a plurality of column select lines.

16. The processor-based system of claim 11 wherein the main memory array and the redundant memory array are arranged in sections of redundant memory having rows and wherein the replacement units include columns of redundant memory from a plurality of sections, each section of a replacement unit having a number of rows different than the number of rows in a section of the main memory array.

17. The processor-based system of claim 16 wherein the number of rows in the sections of the replacement units of the redundant memory array is less than the number of rows of the sections of memory of the main memory array.

18. The processor-based system of claim 16 wherein the memory array further comprises redundant rows of memory configured to replace rows of memory of the main memory array.

19. The processor-based system of claim 18 wherein the redundant rows of memory comprise redundant rows of memory located in the redundant memory array.

20. The processor-based system of claim 18 wherein the redundant rows of memory comprises redundant rows of memory located in the main memory array.

* * * * *